United States Patent
Keller et al.

(10) Patent No.: US 9,627,195 B2
(45) Date of Patent: Apr. 18, 2017

(54) BUFFER LAYER STRUCTURES SUITED FOR III-NITRIDE DEVICES WITH FOREIGN SUBSTRATES

(71) Applicant: Transphorm Inc., Goleta, CA (US)

(72) Inventors: Stacia Keller, Santa Barbara, CA (US); Brian L. Swenson, Santa Barbara, CA (US); Nicholas Fichtenbaum, Newbury Park, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/885,943

(22) Filed: Oct. 16, 2015

(65) Prior Publication Data

US 2016/0042946 A1   Feb. 11, 2016

Related U.S. Application Data

(63) Continuation of application No. 13/366,090, filed on Feb. 3, 2012, now Pat. No. 9,165,766.

(51) Int. Cl.
*H01L 21/02* (2006.01)
*H01L 29/778* (2006.01)
(Continued)

(52) U.S. Cl.
CPC .... *H01L 21/02507* (2013.01); *H01L 21/0237* (2013.01); *H01L 21/0254* (2013.01);
(Continued)

(58) Field of Classification Search
None
See application file for complete search history.

(56) References Cited

U.S. PATENT DOCUMENTS 4,300,091 A   11/1981   Schade, Jr.
4,645,562 A   2/1987   Liao et al.
(Continued)

FOREIGN PATENT DOCUMENTS

CN   1748320   3/2006
CN   101107713   1/2008
(Continued)

OTHER PUBLICATIONS

Authorized officer Chung Keun Lee, International Search Report and Written Opinion in PCT/US2008/076030, mailed Mar. 23, 2009, 10 pages.
(Continued)

*Primary Examiner* — Angel Roman
*Assistant Examiner* — Kevin Quinto
(74) *Attorney, Agent, or Firm* — Fish & Richardson P.C.

(57) ABSTRACT

Embodiments of the present disclosure include a buffer structure suited for III-N device having a foreign substrate. The buffer structure can include a first buffer layer having a first aluminum composition and a second buffer layer formed on the first buffer layer, the second buffer layer having a second aluminum composition. The buffer structure further includes a third buffer layer formed on the second buffer layer at a second interface, the third buffer layer having a third aluminum composition. The first aluminum composition decreases in the first buffer layer towards the interface and the second aluminum composition throughout the second buffer layer is greater than the first aluminum composition at the interface.

19 Claims, 5 Drawing Sheets

(51) Int. Cl.
*H01L 29/10* (2006.01)
*H01L 29/20* (2006.01)
*H01L 29/66* (2006.01)

(52) U.S. Cl.
CPC .. *H01L 21/02381* (2013.01); *H01L 21/02458* (2013.01); *H01L 21/02505* (2013.01); *H01L 21/02579* (2013.01); *H01L 21/02581* (2013.01); *H01L 29/1075* (2013.01); *H01L 29/2003* (2013.01); *H01L 29/66462* (2013.01); *H01L 29/7787* (2013.01)

(56) References Cited

U.S. PATENT DOCUMENTS

| | | | |
|---|---|---|---|
| 4,728,826 A | 3/1988 | Einzinger et al. |
| 4,821,093 A | 4/1989 | Iafrate et al. |
| 4,884,112 A | 11/1989 | Lorenzo et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,316,793 B1 | 11/2001 | Sheppard et al. |
| 6,373,082 B1 | 4/2002 | Ohno et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,727,531 B1 | 4/2004 | Redwing et al. |
| 6,777,278 B2 | 8/2004 | Smith |
| 6,849,882 B2 | 2/2005 | Chavarkar et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,071,498 B2 | 7/2006 | Johnson et al. |
| 7,084,475 B2 | 8/2006 | Shelton et al. |
| 7,125,786 B2 | 10/2006 | Ring et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,456,443 B2 | 11/2008 | Saxler et al. |
| 7,465,967 B2 | 12/2008 | Smith et al. |
| 7,501,669 B2 | 3/2009 | Parikh et al. |
| 7,544,963 B2 | 6/2009 | Saxler |
| 7,547,925 B2 | 6/2009 | Wong et al. |
| 7,548,112 B2 | 6/2009 | Sheppard |
| 7,550,783 B2 | 6/2009 | Wu et al. |
| 7,550,784 B2 | 6/2009 | Saxler et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,612,390 B2 | 11/2009 | Saxler et al. |
| 7,615,774 B2 | 11/2009 | Saxler |
| 7,638,818 B2 | 12/2009 | Wu et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,745,851 B2 | 6/2010 | Harris |
| 7,755,108 B2 | 7/2010 | Kuraguchi |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,642 B2 | 9/2010 | Suh et al. |
| 7,812,369 B2 | 10/2010 | Chini et al. |
| 7,855,401 B2 | 12/2010 | Sheppard et al. |
| 7,875,537 B2 | 1/2011 | Suvorov et al. |
| 7,875,914 B2 | 1/2011 | Sheppard |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,960,756 B2 | 6/2011 | Sheppard et al. |
| 7,965,126 B2 | 6/2011 | Honea et al. |
| 7,985,986 B2 | 7/2011 | Heikman et al. |
| 8,049,252 B2 | 11/2011 | Smith et al. |
| 2001/0032999 A1 | 10/2001 | Yoshida |
| 2001/0040247 A1 | 11/2001 | Ando et al. |
| 2002/0036287 A1 | 3/2002 | Yu et al. |
| 2002/0121648 A1 | 9/2002 | Hsu et al. |
| 2002/0167023 A1 | 11/2002 | Chavarkar et al. |
| 2003/0003724 A1 | 1/2003 | Uchiyama et al. |
| 2003/0006437 A1 | 1/2003 | Mizuta et al. |
| 2003/0020092 A1 | 1/2003 | Parikh et al. |
| 2004/0041169 A1 | 3/2004 | Ren et al. |
| 2004/0061129 A1 | 4/2004 | Saxler et al. |
| 2004/0164347 A1 | 8/2004 | Zhao et al. |
| 2005/0077541 A1 | 4/2005 | Shen et al. |
| 2005/0110043 A1 | 5/2005 | Otsuka et al. |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0253168 A1 | 11/2005 | Wu et al. |
| 2005/0274977 A1 | 12/2005 | Saito et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0226442 A1 | 10/2006 | Zhang et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |

(56) References Cited

U.S. PATENT DOCUMENTS

| | | |
|---|---|---|
| 2007/0045670 A1 | 3/2007 | Kuraguchi |
| 2007/0080672 A1 | 4/2007 | Yang |
| 2007/0128743 A1 | 6/2007 | Huang et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0278518 A1 | 12/2007 | Chen et al. |
| 2007/0295985 A1 | 12/2007 | Weeks, Jr. et al. |
| 2008/0054247 A1 | 3/2008 | Eichler et al. |
| 2008/0073670 A1 | 3/2008 | Yang et al. |
| 2008/0093621 A1 | 4/2008 | Takeda et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0072272 A1 | 3/2009 | Suh et al. |
| 2009/0075455 A1 | 3/2009 | Mishra |
| 2009/0085065 A1 | 4/2009 | Mishra et al. |
| 2009/0140262 A1 | 6/2009 | Ohki et al. |
| 2009/0146185 A1 | 6/2009 | Suh et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2009/0278144 A1 | 11/2009 | Sonobe et al. |
| 2010/0019225 A1 | 1/2010 | Lee |
| 2010/0019279 A1 | 1/2010 | Chen et al. |
| 2010/0065923 A1 | 3/2010 | Charles et al. |
| 2010/0067275 A1 | 3/2010 | Wang et al. |
| 2010/0133506 A1 | 6/2010 | Nakanishi et al. |
| 2010/0140660 A1 | 6/2010 | Wu et al. |
| 2010/0201439 A1 | 8/2010 | Wu et al. |
| 2010/0203234 A1 | 8/2010 | Anderson et al. |
| 2010/0219445 A1 | 9/2010 | Yokoyama et al. |
| 2010/0244087 A1 | 9/2010 | Horie et al. |
| 2010/0244100 A1 | 9/2010 | Oishi et al. |
| 2010/0264461 A1 | 10/2010 | Rajan et al. |
| 2010/0288998 A1 | 11/2010 | Kikuchi et al. |
| 2011/0001127 A1 | 1/2011 | Sakamoto et al. |
| 2011/0006346 A1 | 1/2011 | Ando et al. |
| 2011/0012110 A1 | 1/2011 | Sazawa et al. |
| 2011/0031532 A1 | 2/2011 | Kikkawa et al. |
| 2011/0062556 A1 | 3/2011 | Komiyama et al. |
| 2011/0249359 A1 | 10/2011 | Mochizuki et al. |
| 2012/0104557 A1* | 5/2012 | Yoshida .............. C30B 25/02 257/615 |
| 2012/0161150 A1* | 6/2012 | Kohler ............... H01L 29/7787 257/76 |
| 2012/0168822 A1 | 7/2012 | Matsushita |
| 2012/0193638 A1 | 8/2012 | Keller et al. |
| 2012/0211800 A1 | 8/2012 | Boutros |
| 2012/0217512 A1 | 8/2012 | Renaud |
| 2012/0315445 A1 | 12/2012 | Mizuhara et al. |
| 2013/0200495 A1 | 8/2013 | Keller et al. |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| EP | 2 216 806 | 8/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-235473 | 8/2004 |
| JP | 2004-260114 | 9/2004 |
| JP | 2006-032749 | 2/2006 |
| JP | 2007-036218 | 2/2007 |
| JP | 2007-215331 | 8/2007 |
| JP | 2007-221001 | 8/2007 |
| JP | 2008-171843 | 7/2008 |
| JP | 2008-199771 | 8/2008 |
| JP | 2009-158804 | 7/2009 |
| JP | 2009-158969 | 7/2009 |
| JP | 2010-087076 | 4/2010 |
| JP | 2010-182812 | 8/2010 |
| JP | 2010-539712 | 12/2010 |
| JP | 2011-082494 | 4/2011 |
| KR | 10-2009-0122214 | 11/2009 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Chung Keun Lee, International Search Report and Written Opinion in PCT/US2008/076079, mailed Mar. 20, 2009, 11 pages.

Authorized officer Nora Lindner, International Preliminary Report on Patentability in PCT/US2008/076079, mailed Apr. 1, 2010, 6 pages.

Authorized officer Keon Hyeong Kim, International Search Report and Written Opinion in PCT/US2008/076160 mailed Mar. 18, 2009, 11 pages.

Authorized officer Simin Baharlou, International Preliminary Report on Patentability in PCT/US2008/076160, mailed Mar. 25, 2010, 6 pages.

(56) References Cited

OTHER PUBLICATIONS

Authorized officer Chung Keun Lee, International Search Report and Written Opinion in PCT/US2008/076199, mailed Mar. 24, 2009, 11 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Hye Lyun Park, International Search Report and Written Opinion in PCT/US2013/050914, mailed Oct. 18, 2013, 11 pages.
Authorized officer Sang Won Choi, International Search Report and Written Opinion in PCT/US2013/024470, mailed May 27, 2013, 12 pages.
Authorized officer Simin Baharlou, International Preliminary Report on Patentability in PCT/US2013/024470, mailed Aug. 14, 2014, 9 pages.
European Search Report in Application No. 10 81 5813.0, mailed Mar. 12, 2013, 9 pages.
Search Report and Action in TW Application No. 098132132, issued Dec. 6, 2012, 8 pages.
Ando et al., "10-W/mm AlGaN—GaN HFET with a Field Modulating Plate," IEEE Electron Device Letters, 2003, 24(5):289-291.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Chen et al., "High-performance AlGaN/GaN Lateral Field-effect Rectifiers Compatible with High Electron Mobility Transistors," Applied Physics Letters, 2008, 92, 253501-1-3.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design," Applied Physics Letters, 2002, 80(23):4387-4389.

(56) References Cited

OTHER PUBLICATIONS

Keller et al., "Method for Heteroepitaxial Growth of High Quality N-Face GaN, InN and Aln and their Alloys by Metal Organic Chemical Vapor Deposition," U.S. Appl. No. 60/866,035, filed Nov. 15, 2006, 31 pages.

Khan et al., "AlGaN/GaN Metal Oxide Semiconductor Heterostructure Field Effect Transistor," IEEE Electron Device Letters, 2000, 21(2):63-65.

Kim, "Process Development and Device Characteristics of AlGaN/GaN HEMTs for High Frequency Applications," PhD Thesis, University of Illinois at Urbana-Champaign, 2007, 120 pages.

Kumar et al., "High Transconductance Enhancement-mode AlGaN/GaN HEMTs on SiC Substrate," Electronics Letters, 2003, 39(24):1758-1760.

Kuraguchi et al., "Normally-off GaN-MISFET with Well-controlled Threshold Voltage," Phys. Stats. Sol., 2007, 204(6):2010-2013.

Lanford et al., "Recessed-gate Enhancement-mode GaN HEMT with High Threshold Voltage," Electronic Letters, 2005, 41(7):449-450.

Lee et al., "Self-aligned Process for Emitter- and Base-regrowth GaN HBTs and BJTs," Solid-State Electronics, 2001, 45:243-247.

Mishra et al., "N-face High Electron Mobility Transistors with Low Buffer Leakage and Low Parasitic Resistance," U.S. Appl. No. 60/908,914, filed Mar. 29, 2007, 21 pages.

Mishra et al., "Polarization-induced Barriers for N-face Nitride-based Electronics," U.S. Appl. No. 60/940,052, filed May 24, 2007, 29 pages.

Mishra et al., "Growing N-polar III-nitride structures," U.S. Appl. No. 60/972,467, filed Sep. 14, 2007, 7 pages.

Mishra et al., "AlGaN/GaN HEMTs—An Overview of Device Operation and Applications," Proceedings of the IEEE, 2002, 90(6):1022-1031.

Nanjo et al., "Remarkable Breakdown Voltage Enhancement in AlGaN Channel High Electron Mobility Transistors," Applied Physics Letters 92 (2008), 3 pages.

Napierala et al., "Selective GaN Epitaxy on Si(111) Substrates Using Porous Aluminum Oxide Buffer Layers," Journal of the Electrochemical Society, 2006. 153(2):G125-G127, 4 pages.

Ota and Nozawa, "AlGaN/GaN Recessed MIS-gate HFET with High-threshold-voltage Normally-off Operation for Power Electronics Applications," IEEE Electron Device Letters, 2008, 29(7):668-670.

Palacios et al., "AlGaN/GaN HEMTs with an InGaN-based Back-barrier," Device Research Conference Digest, 2005, DRC '05 63rd, pp. 181-182.

Palacios et al., "AlGaN/GaN High Electron Mobility Transistors with InGaN Back-Barriers," IEEE Electron Device Letters, 2006, 27(1):13-15.

Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.

Palacios et al., "Nitride-based High Electron Mobility Transistors with a GaN Spacer," Applied Physics Letters, 2006, 89:073508-1-3.

Pei et al., "Effect of Dielectric Thickness on Power Performance of AlGaN/GaN HEMTs," IEEE Electron Device Letters, 2009, 30(4):313-315.

"Planar, Low Switching Loss, Gallium Nitride Devices for Power Conversion Applications," SBIR N121-090 (Navy), 2012, 3 pages.

Rajan et al., "Advanced Transistor Structures Based on N-face GaN," 32M International Symposium on Compound Semiconductors (ISCS), Sep. 18-22, 2005, Europa-Park Rust, Germany, 2 pages.

Saito et al., "Recessed-gate Structure Approach Toward Normally Off High-voltage AlGaN/GaN HEMT for Power Electronics Applications," IEEE Transactions on Electron Device, 2006, 53(2):356-362.

Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.

Shen, "Advanced Polarization-based Design of AlGaN/GaN HEMTs," Jun. 2004, PhD Thesis, University of California, Santa Barbara, 192 pages.

Sugiura et al., "Enhancement-mode n-channel GaN MOSFETs Fabricated on p-GaN Using $HfO_2$ as Gate Oxide," Electronics Letters, 2007, vol. 43, No. 17, 2 pages.

Suh et al., "High Breakdown Enhancement Mode GaN-based HEMTs with Integrated Slant Field Plate," U.S. Appl. No. 60/822,886, filed Aug. 18, 2006, 16 pages.

Suh et al. "High-Breakdown Enhancement-mode AlGaN/GaN HEMTs with Integrated Slant Field-Plate," Electron Devices Meeting, 2006, IEDM '06 International, 3 pages.

Suh et al., "III-Nitride Devices with Recessed Gates," U.S. Appl. No. 60/972,481, filed Sep. 14, 2007, 18 pages.

Tipirneni et al. "Silicon Dioxide-encapsulated High-Voltage AlGaN/GaN HFETs for Power-Switching Applications," IEEE Electron Device Letters, 2007, 28(9):784-786.

Vetury et al., "Direct Measurement of Gate Depletion in High Breakdown (405V) Al/GaN/GaN Heterostructure Field Effect Transistors," IEDM 98, 1998, pp. 55-58.

Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.

Wang et al., "Enhancement-mode $Si_3N_4$/AlGaN/GaN MISHFETs," IEEE Electron Device Letters, 2006, 27(10):793-795.

Wu, "AlGaN/GaN Microwave Power High-Mobility Transistors," PhD Thesis, University of California, Santa Barbara, Jul. 1997, 134 pages.

Wu et al., "A 97.8% Efficient GaN HEMT Boost Converter with 300-W Output Power at 1 MHz," Electronic Device Letters, 2008, IEEE, 29(8):824-826.

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

Notice of Reasons for Rejection in JP Application No. 2014-555787, mailed on Aug. 16, 2016, 15 pages.

\* cited by examiner

BUFFER LAYER STRUCTURES SUITED FOR III-NITRIDE DEVICES WITH FOREIGN SUBSTRATES

CROSS-REFERENCE TO RELATED APPLICATION

This is a continuation of U.S. application Ser. No. 13/366,090, filed on Feb. 3, 2012, the disclosure of which is hereby incorporated by reference in its entirety.

BACKGROUND

As large native substrates for group III-Nitride (III-N) semiconductors are not yet widely available, III-N films, such as GaN and its alloys, are currently grown by heteroepitaxy on suitable non-III-N substrates. Typically, the films are grown on sapphire ($Al_2O_3$), silicon carbide (SiC), or silicon substrates. Silicon substrates are emerging as a particularly attractive substrate candidate for III-N layers due to their low cost, wide availability, large wafer sizes, thermal properties, and ease of integration with silicon-based electronics. However, due to the large lattice mismatch and thermal expansion coefficient mismatch between silicon and III-N materials, there is typically a net tensile stress in III-N epitaxial layers deposited directly on silicon substrates.

This mismatch can result in cracking of the layers and thus thick III-N layers that are crack-free and that exhibit adequate structural quality can be difficult to grow on silicon substrates. For example, the maximum thickness of III-N layers that can be grown without sustaining substantial defects may be limited. If the III-N layers are grown too thick, tensile stress that develops in the layers upon cooling becomes substantial, which can cause cracking of the layers. In many applications in which III-N heteroepitaxial layers are used, it may be necessary that very thick III-N layers of adequate quality be grown on the foreign substrates.

TECHNICAL FIELD

The disclosed technology relates to buffer layer design for stress management in III-Nitride devices grown on foreign substrates.

SUMMARY

In one aspect, a method of forming a III-N layer structure is described. The method includes forming a first III-N buffer layer having a first aluminum composition on a first material layer, where the first III-N buffer layer has a first side adjacent to the first material layer and a second side opposite the first side. The method further includes forming a second III-N buffer layer on the second side of the first III-N buffer layer, where the second III-N buffer layer has a second aluminum composition and is greater than 15 nanometers thick. The first aluminum composition is substantially constant throughout the first III-N buffer layer or decreases from the first side to the second side, and the second aluminum composition throughout the second III-N buffer layer is greater than the first aluminum composition at the second side of the first III-N buffer layer.

In another aspect, a method of forming a III-N layer structure is described. The method includes forming a first III-N buffer layer having a first aluminum composition on a first material layer, where the first III-N buffer layer has a first side adjacent to the first material layer and a second side opposite the first side. The method further includes forming a second III-N buffer layer on the second side of the first III-N buffer layer, where the second III-N buffer layer has a second aluminum composition and is greater than 15 nanometers thick. The first aluminum composition is not increasing from the first side to the second side, and the second aluminum composition throughout the second III-N buffer layer is greater than the first aluminum composition at the second side of the first III-N buffer layer.

The methods described herein can include one or more of the following steps or features. The first material layer can be a substrate. The substrate can be removed to expose a surface of the III-N layer structure. The second III-N buffer layer can be greater than 30 nanometers or greater than 100 nanometers thick. A third III-N buffer layer can be formed, wherein the second III-N buffer layer is between the first III-N buffer layer and the third III-N buffer layer. Forming the first, second, or third III-N buffer layer can include doping the first, second, or third III-N buffer layer, respectively, with at least one element selected from the group consisting of iron (Fe), magnesium (Mg), and carbon (C). The third III-N buffer layer can be free of aluminum or can have a third aluminum composition, wherein the second aluminum composition is uniform throughout the second III-N buffer layer, and the third aluminum composition throughout the third III-N buffer layer is lower than the second aluminum composition. The third III-N buffer layer can be free of aluminum or can have a third aluminum composition, wherein the second aluminum composition is non-uniform throughout the second III-N buffer layer, and the third aluminum composition throughout the third III-N buffer layer is lower than a lowest value of the second aluminum composition. The third III-N buffer layer can have a first side adjacent to the second III-N buffer layer and a second side opposite the first side, where the third aluminum composition is constant or decreases from the first side of the third III-N buffer layer to the second side of the third III-N buffer layer. The third aluminum composition can be zero throughout the third III-N buffer layer.

An active device layer can be formed over the third III-N buffer layer, the active device layer including or being formed of a III-N semiconductor material. The III-N layer structure can further include a conductive channel of an electronic semiconductor device in the active device layer, with the conductive channel separated from the third III-N buffer layer by at least 20 nanometers. The methods can further include forming an electrode of the electronic semiconductor device, where the electrode is electrically connected to the conductive channel. A fourth III-N buffer layer having a fourth aluminum composition can be formed over a side of the third III-N buffer layer, where the third III-N buffer layer is free of aluminum or has a third aluminum composition, and the fourth aluminum composition throughout the fourth III-N buffer layer is greater than the third aluminum composition directly adjacent to the side of the third III-N buffer layer. A fifth III-N buffer layer having a fifth aluminum composition can be formed over a side of the fourth III-N buffer layer, wherein the fifth aluminum composition throughout the fifth III-N buffer layer is lower than a lowest value of the fourth aluminum composition. The fourth III-N buffer layer can be at least 20 nanometers or at least 50 nanometers thick. The first aluminum composition can be substantially constant in the first III-N buffer layer. The first aluminum composition can decrease from the first side of the first III-N buffer layer to the second side of the first III-N buffer layer.

In another aspect, a III-N layer structure is described. The structure includes a first III-N buffer layer having a first aluminum composition on a first material layer. The first III-N buffer layer has a first side adjacent to the first material layer and a second side opposite the first side. The structure further includes a second III-N buffer layer on the second side of the first III-N buffer layer. The second III-N buffer layer has a second aluminum composition and is greater than 15 nanometers thick. The first aluminum composition is substantially constant in the first III-N buffer layer or decreases from the first side to the second side, and the second aluminum composition in the second III-N buffer layer is greater than the first aluminum composition at the second side of the first III-N buffer layer.

In yet another aspect, a III-N structure is described. The structure includes a substrate and a first III-N layer having a first aluminum composition on the substrate. The first III-N layer has a first side adjacent to the substrate and a second side opposite the first side. The structure further includes a second III-N layer on the second side of the first III-N layer, where the second III-N layer has a second aluminum composition and is greater than 30 nanometers thick. The structure further includes a third III-N layer having a third aluminum composition on an opposite side of the second III-N layer from the first III-N layer. The third III-N layer has a first side adjacent to the second III-N layer and a second side opposite the first side. The first aluminum composition is near constant in the first III-N layer or decreases from the first side of the first III-N layer to the second side of the first III-N layer, the second aluminum composition in the second III-N layer is greater than the first aluminum composition at the second side of the first III-N layer, and the third aluminum composition at the first side of the third III-N layer is less than a minimum value of the second aluminum composition.

III-N structures described herein can include one or more of the following features. The first material layer can be a substrate or a foreign substrate. The second III-N layer or second III-N buffer layer can be greater than 100 nanometers thick. The first aluminum composition can be monotonically decreasing from the first side to the second side. The first aluminum composition can be decreasing in a continuous grade from the first side to the second side. The first III-N layer or first III-N buffer layer can include a first portion with a constant aluminum composition and a second portion with an aluminum composition that decreases monotonically in a direction from the first side to the second side. The first aluminum composition can be decreasing in discrete steps from the first side to the second side. The structure can further include a third III-N buffer layer having a third aluminum composition, where the second III-N buffer layer is between the first and third III-N buffer layers.

The first, second, or third III-N layer or buffer layer can be doped with at least one element selected from the group consisting of iron (Fe), magnesium (Mg), and carbon (C). The second aluminum composition can be uniform throughout the second III-N buffer layer, and the third aluminum composition throughout the third III-N buffer layer can be lower than the second aluminum composition. The second aluminum composition can be non-uniform throughout the second III-N buffer layer, and the third aluminum composition throughout the third III-N buffer layer can be lower than a lowest value of the second aluminum composition. The third III-N buffer layer can have a first side adjacent to the second III-N buffer layer and a second side opposite the first side, where the third aluminum composition decreases from the first side of the third III-N buffer layer to the second side of the III-N buffer layer. The third III-N buffer layer can have a first side adjacent to the second III-N buffer layer and a second side opposite the first side, where the third aluminum composition decreases monotonically from the first side of the third III-N buffer layer to the second side of the third III-N buffer layer. The third aluminum composition can be constant or zero throughout the third III-N layer or third III-N buffer layer.

A combined thickness of the first, second, and third III-N buffer layers can be greater than 3 μm, 5 μm, or 7 μm. The first, second, and third III-N layers or buffer layers can each include aluminum gallium nitride. The structure can further include an active device layer over the third III-N layer or buffer layer, where the active device layer includes or is formed of a III-N semiconductor material. The structure can further include a conductive channel of an electronic semiconductor device in the active device layer, where the conductive channel is separated from the third III-N layer or buffer layer by at least 20 nanometers. The structure can further include an electrode, wherein the electrode is electrically connected to the conductive channel. A III-N semiconductor device can include or be formed from the structure. The substrate of the III-N semiconductor device can include silicon, silicon carbide, or sapphire material. The III-N semiconductor device can further include a third III-N buffer layer having a third aluminum composition, where the second III-N buffer layer is between the first and third III-N buffer layers. The second aluminum composition in the III-N semiconductor device can be constant or non-uniform throughout the second III-N buffer layer, and the third aluminum composition throughout the third III-N buffer layer can be lower than a lowest value of the second aluminum composition. The second III-N buffer layer in the III-N semiconductor device can be greater than 100 nanometers thick.

The III-N semiconductor device can further include an active device layer over the third III-N buffer layer, the active device layer including or being formed of a III-N semiconductor material. The III-N semiconductor device can further include a conductive channel in the active device layer. The III-N semiconductor device can be an electronic device. The conductive channel of the III-N semiconductor device can be separated from the third III-N buffer layer by at least 20 nanometers. The III-N semiconductor device can be a transistor or a diode. The III-N semiconductor device can further include an electrode, where the electrode is electrically connected to the conductive channel.

The first, second, or third III-N buffer layer of the III-N semiconductor device can be doped with iron (Fe), magnesium (Mg), carbon (C), or combinations of the above. The first and second III-N buffer layers of the III-N semiconductor device can include or be formed of aluminum gallium nitride or boron aluminum indium gallium nitride. The third aluminum composition throughout the third III-N layer or buffer layer can be less than a minimum value of the second aluminum composition. The substrate can include or be formed of silicon, SiC, or sapphire. The structure can further include a nucleation layer formed between the substrate and the first III-N layer or buffer layer. The first or second III-N layer or buffer layer can include $B_aAl_bIn_cGa_dN$, where $a+b+c+d$ is substantially 1, or $Al_xGa_yN$, where $x+y$ is substantially 1.

BRIEF DESCRIPTION OF DRAWINGS

Like reference symbols in the various drawings indicate like elements.

DETAILED DESCRIPTION

Figure 1:
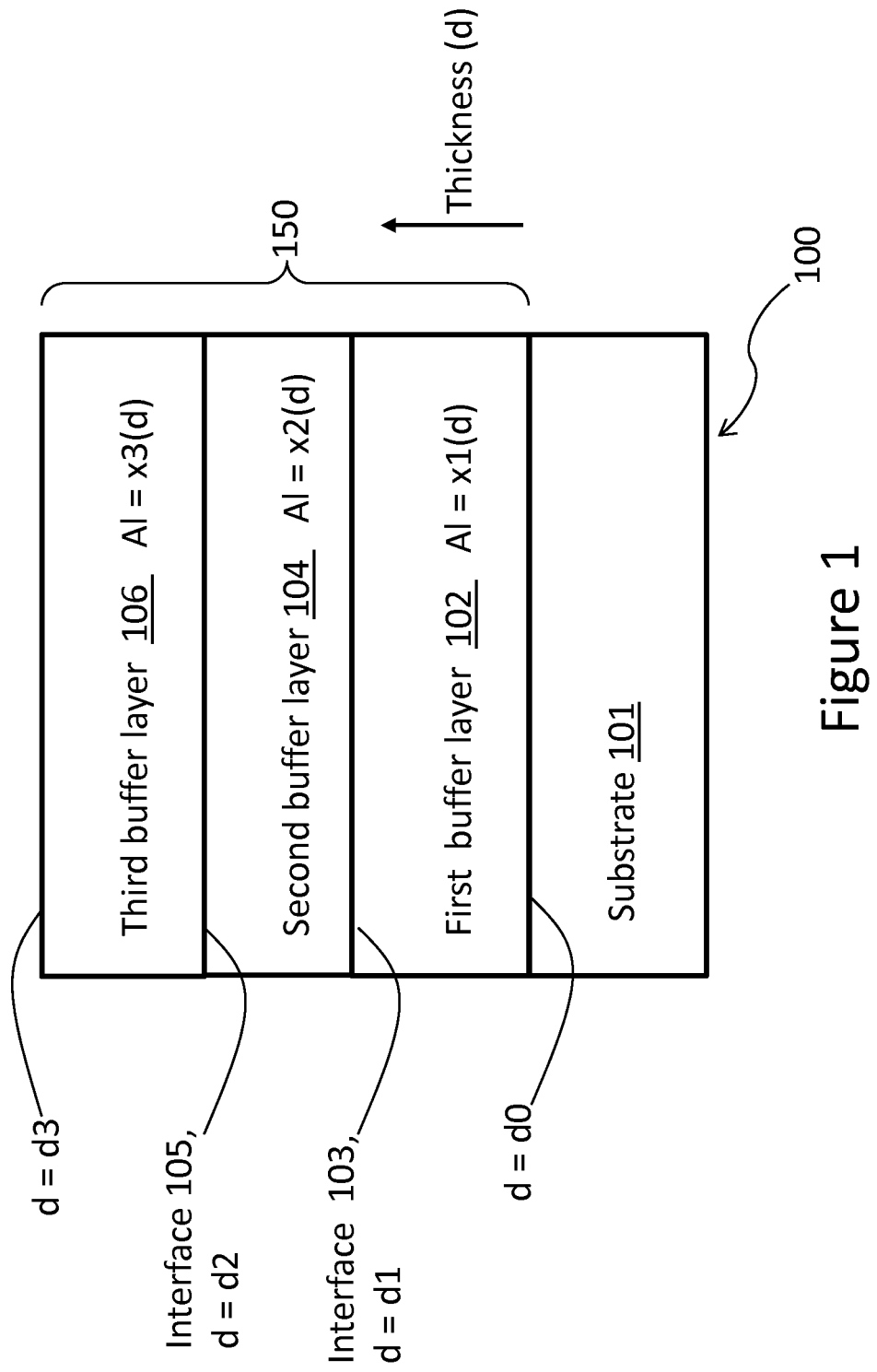
FIG. 1 is a cross-sectional view of the buffer layers in a buffer structure.

Embodiments of the present disclosure include buffer layer structures suited for semiconductor devices, in particular, III-N devices or semiconductor devices formed on or including a foreign substrate. In the case of III-N layers grown on foreign substrates, the mismatch of lattice constants and thermal expansion coefficients, as well as chemical and structural properties, between the substrate and the III-N epitaxial layers can cause substantial stress in the layers during growth, causing the III-N layers to be in a strained state during growth. In addition, the mismatch of thermal coefficients of expansion between the III-N layers and the foreign substrates on which they are grown or deposited can cause further strain in the III-N layers as the layers are cooled from growth temperature, which is typically in the range of about 700° C.-1500° C., to room temperature (i.e., 25° C.).

Since the thermal expansion coefficients of non-native substrates (e.g., foreign substrates) such as SiC and silicon substrates, are smaller than those of gallium nitride and its alloys, when III-N films/stacks grown on foreign substrates are cooled from growth temperature to room temperature, the stress in the III-N films becomes more tensile and/or less compressive. If the stress in the III-N films at room temperature is too highly tensile, defects such as cracks can develop in the III-N layers. Hence, the final III-N film/stack that is on the substrate needs to be under a sufficiently compressive stress at growth temperature in order to compensate for the tensile stress that develops during cool down. Typically, to prevent cracking of the epitaxial III-N films, the films are under sufficiently high compressive stress at growth temperature just prior to cooling such that the films are substantially stress free or are under small compressive stress at room temperature. However, if at any time during growth the stress in the III-N films is too high, defects such as dislocations or island formation may develop in the III-N films during growth, which can degrade performance of devices formed on the films. Hence, it is desirable for the final III-N films to be under a sufficiently large compressive stress such that when they are cooled to room temperature, the films are substantially stress free or are under low compressive or tensile stress, while at all times during growth the stress that develops during growth never exceeds the critical value that results in defect formation in the films.

When III-N films are grown on silicon substrates, where the thermal expansion coefficient difference between the substrate and the epitaxially grown films is the largest, a variety of buffer layer solutions for producing high quality III-N films are possible, for example grading the composition of $Al_xGa_{1-x}N$ buffer films from aluminum nitride (x=1) in a region proximal to the substrate to gallium nitride (x=0) in a region distal from the substrate, deposition of thin (e.g., thinner than 10 nm) AlN or AlGaN interlayers within the buffer structure, insertion of an AlN—GaN superlattice with thin (e.g., thinner than 10 nm) AlN layers, or growth of AlGaN buffer layers where the aluminum composition is stepwise reduced as distance from the substrate increases.

In the cases of a graded $Al_xGa_{1-x}N$ buffer and of AlGaN buffer layers where the aluminum composition is stepwise reduced as distance from the substrate increases, the Al composition $x_{Al}$ in the buffer films remains constant or decreases monotonically away from the substrate everywhere within the buffer structure, for example decreasing from 1 or near 1 in the AlN nucleation layer adjacent to the substrate to 0 or near 0 in the portion of the buffer layer distal from the substrate. In buffer structures which include thin AlN or AlGaN interlayers, or which include AlN—GaN superlattices with thin AlN layers, the Al composition of the buffer films remains constant or decreases monotonically away from the substrate everywhere except at the bottom interface (i.e., the interface nearest to the substrate) of each thin AlN or AlGaN film.

In many applications, for example in high-power III-Nitride electronic devices such as high-power transistors or diodes, it is desirable that the average aluminum (Al) composition of all of the buffer layers be as large as possible, for example in order to decrease subsurface leakage currents and/or increase the device breakdown voltage. However, maintaining too high an Al composition over a thick layer in the buffer structure can result in degradation of the material properties within the buffer structure.

Furthermore, in many semiconductor device applications, it is desirable that the total thickness of the III-N buffer layers underlying the device active layers be relatively thick, for example at least 3 microns or at least 5 microns thick. In layer structures employing a graded $Al_xGa_{1-x}N$ buffer, or a series of AlGaN buffer layers where the aluminum composition is stepwise reduced as distance from the substrate increases, the compressive stress in the III-N layers constantly increases as more III-N buffer material is deposited. The critical stress level for formation of cracks or other defects is typically reached before a sufficiently thick III-N buffer layer is deposited or grown. Hence, formation of sufficiently thick III-N buffer structures that employ such III-N layer structures may not be possible in some applications.

As used herein, the terms III-Nitride or III-N materials, layers or devices refer to a material or device comprised of a compound semiconductor material according to the stoichiometric formula $Al_xIn_yGa_zN$, where x+y+z is about 1. Here, x, y, and z are fractional compositions of Al, In, and Ga, respectively. A "substrate" is a semiconductor material layer on top of which additional semiconductor material layers of a semiconductor device are deposited, for example epitaxially grown, such that the crystalline structure of the grown semiconductor material contacting or adjacent to the substrate at least partially conforms to, or is at least partially determined by, the crystalline structure of the substrate. Epitaxial growth of a second semiconductor material on a first semiconductor material can result in the crystalline structure of the second semiconductor material contacting or adjacent to the first semiconductor material to at least partially conform to, or to at least be partially determined by, the crystalline structure of the first semiconductor material. Conversely, when a second semiconductor material is bonded to or attached to a first semiconductor material, the crystalline structures of the two semiconductor materials typically do not conform to one another.

A "foreign substrate" is a substrate formed of a material that is substantially different in composition and/or structure from the semiconductor materials which are grown atop the substrate, while a "native substrate" is a substrate formed of a material that is substantially similar to or has the same composition and/or structure as the semiconductor materials which are grown atop the substrate. Examples of foreign substrates used for growth of III-N materials include sapphire ($Al_2O_3$), silicon carbide (SiC), silicon (Si), and amorphous or polycrystalline aluminum nitride (AlN) substrates. Examples of native substrates used for growth of III-N materials include gallium nitride (GaN) and crystalline AlN.

When III-Nitride semiconductor materials to be used in devices such as transistors, diodes, lasers, LEDs, photovoltaic cells, or other devices are formed on foreign substrates, one or more III-N buffer layers are typically grown on the substrate between the substrate and the active semiconductor device layer(s), for example, in order to minimize defects in the active layer(s) and/or control stress in the semiconductor layer structure. In the case of electronic semiconductor devices, such as transistors and diodes, layers which contain a conductive device channel, such as a two-dimensional electron gas (2 DEG), are referred to as "channel layers". While in many cases more than one layer in an electronic device may contain a 2 DEG or other conductive channel, channel layers are layers through which on-state device current flows. As such, the device channel(s) in the channel layer(s) are electrically connected to at least one of the device electrodes (e.g., source, drain, anode, or cathode electrode), such that current flows from the device channel into the device electrode during device operation.

The semiconductor layer containing the channel typically includes a portion (in the thickness direction) which lies between the channel and the substrate. In some cases, that portion is greater than 20 nanometers thick. In such cases, the device "channel layer" refers to the portion of the semiconductor layer containing the device channel that is within 20 nanometers of the device channel in the thickness direction.

Channel layers of semiconductor electronic devices, along with the semiconductor layers deposited or formed on top of the channel layers (i.e., on a side of the channel layer(s) opposite from the substrate) are collectively referred to as "active layers", as they can impact the output current characteristics of the device. In some implementations, active layers of an electronic semiconductor device include all semiconductor layers that are formed on a side of at least one conductive device channel opposite from the substrate. In other implementations, active semiconductor layers include all semiconductor layers which are above or below at least one conductive device channel and are less than 100 nanometers, less than 50 nanometers, or less than 20 nanometers (in the thickness direction) from the device channel.

In the case of optical or optoelectronic semiconductor devices, such as lasers, LEDs, and photovoltaic devices, active layers include layers designed to absorb or emit light during device operation. Active layers also include layers such as cladding and mirror layers, which are designed to confine photons or current carriers (i.e., electrons and/or holes) to the emitting or absorbing layers. In some implementations, active layers of an optical or optoelectronic semiconductor device include all semiconductor layers which are less than 1 micron, less than 500 nanometers, less than 200 nanometers, less than 100 nanometers, or less than 50 nanometers away from any semiconductor layers which are configured to absorb or emit light.

As used herein, a "buffer layer" is a semiconductor layer that is disposed or formed between the substrate and the device active layers. Semiconductor material structures for some semiconductor devices include or are formed with a single buffer layer, while others include or are formed with a buffer structure which includes two or more buffer layers.

In some implementations, a buffer layer of an electronic semiconductor device is a semiconductor layer which is disposed or formed between the substrate and the conductive device channels (where a conductive device channel is a conductive region in a semiconductor layer which is electrically connected to, or configured to be electrically connected to, a device electrode, such that current flows from the device channel into the device electrode, or vice-versa, during device operation). Such a buffer layer is separated from the conductive device channels by more than 20 nanometers, more than 50 nanometers, or more than 100 nanometers. In other implementations, a buffer layer of an optical or optoelectronic semiconductor device is a semiconductor layer which is disposed or formed between the substrate and the semiconductor layers which are configured to absorb or emit light, where at least one additional layer is included between the buffer layer and the semiconductor layers which are configured to absorb or emit light, the additional layer(s) being thicker than 1 micron, thicker than 500 nanometers, thicker than 200 nanometers, thicker than 100 nanometers, or thicker than 50 nanometers.

FIG. 1 is a cross-sectional view of substrate and buffer structure 100. The buffer layers 150 can be formed on a substrate 101, which can be a foreign substrate. In some implementations, after the buffer structure 100 is formed, the substrate 101 is removed. In other implementations, after removal of substrate 101, a carrier wafer is attached to the buffer layers 150 at the interface exposed by the removal of substrate 101 (not shown). Carrier wafers can be semiconductors, metals, or insulators. Attaching the buffer layers 150 to a carrier wafer typically does not result in the crystalline structure of any portion of the buffer layers conforming to that of the carrier wafer.

One embodiment of the buffer structure 100 includes a first buffer layer 102, a second buffer layer 104 formed on the first buffer layer 102 at an interface 103, and a third buffer layer 106 formed on the second buffer layer 104 at a second interface 105. The first buffer layer 102 has a first aluminum composition $x1(d)$, the second buffer layer 104 has a second aluminum composition $x2(d)$, and the third buffer layer 106 has a third aluminum composition $x3(d)$. The Al compositions $x1(d)$, $x2(d)$, and $x3(d)$ can each be constant or can vary with distance d from the substrate.

In one embodiment, the first aluminum composition $x1(d)$ of the first buffer layer 102 decreases in the first buffer layer 102 towards the interface 103. Note that the first aluminum composition $x1(d)$ can decrease monotonically towards the interface 103 in a continuous grade or in graded steps, or a combination of continuous grades and graded steps. The first aluminum composition $x1(d)$ can also decrease in discrete steps towards the interface. For example, $x1(d)$ can be constant at portions of the first buffer layer 102 and be stepped abruptly from one portion to another, or graded continuously in others, or any combination of the above. In other embodiments, the first aluminum composition $x1(d)$ is substantially constant (for example, varying by less than 0.02 throughout the layer) or zero in the first buffer layer.

The second aluminum composition $x2(d)$ throughout the second buffer layer 104 can be greater than the first aluminum composition at the interface 103 [$x2(d)>x1(d1)$]. For example, in one implementation the second aluminum composition is uniform [$x2(d)=constant$] throughout the second buffer layer 104, and the third aluminum composition $x3(d)$ of the third buffer layer 106 is everywhere lower than the second aluminum composition [e.g., $x3(d)<x2(d)$].

Alternatively, the second aluminum composition $x2(d)$ can vary throughout the second buffer layer 104 and the third aluminum composition x3(*d*) throughout the third buffer layer 106 can be lower than a lowest value of the second aluminum composition [e.g., x3(*d*)<x2(*d*) for all *d*]. The third aluminum composition x3(*d*) can decrease in the third buffer layer 106 from the second interface 105 towards *d*=d3, or be zero throughout the third buffer layer 106 [x3(*d*)=0]. The thickness (t=d2−d1) of the second buffer layer 104 can be greater than 15 nm, greater than 20 nm, greater than 50 nm, greater than 100 nm, or greater than 200 nm.

Note that the third aluminum composition x3(*d*) can decrease monotonically in the third buffer layer 106 from the second interface 105 towards *d*=d3. The third aluminum composition x3(*d*) may alternatively be constant throughout the third buffer layer 106. The combined thickness of the buffer layers 150 including the first 102, second 104, and third buffer layers 106 can be greater than 3 μm, 5 μm, or 7 μm.

The buffer structure 100 of FIG. 1 can be designed as follows. The first buffer layer 102, in which the aluminum composition decreases away from the substrate, can be configured so that the compressive stress in the layer 102 increases as the thickness of layer 102 increases. First buffer layer 102 is grown to a thickness that is smaller than the critical thickness for defect formation in the layer, after which the second buffer layer 104 is deposited on top of layer 102. The structure of the second buffer layer 104, in which the aluminum composition throughout is greater than that of the portion of buffer layer 102 closest to layer 104, can be such that the compressive stress in the first and/or second buffer layers 102 and 104, respectively, decreases as the thickness of layer 104 increases. Second buffer layer 104 is grown to a thickness that is smaller than the critical thickness for defect formation in the layer but is thick enough to substantially reduce compressive stress in layers 102 and 104. The optimal thickness of layer 104 may depend on the average aluminum composition of layer 104 as well as the total desired thickness of buffer structure 150. For example, for buffer layers 150 which are a total of about 3 microns thick, layer 104 may be greater than 15 nanometers, for example between 15 and 500 nanometers. For buffer layers 150 which are a total of about 5 microns thick, layer 104 may be greater than 25 or 50 nanometers, for example between 25 and 500 nanometers. If the buffer layers 150 are about 7 microns thick, layer 104 may be greater than 100 or 200 nanometers, for example between 100 and 500 nanometers.

After deposition of the second buffer layer 104, the third buffer layer 106 is deposited on top of layer 104. The structure of the third buffer layer 106, in which the aluminum composition remains constant or decreases away from the substrate, can be such that the compressive stress in the buffer layers 150 increases as the thickness of layer 106 increases. Buffer layer 106, along with any III-N layers (e.g., active device layers) grown atop buffer layer 106, can be grown to a thickness such that the total compressive stress in the buffer layers 150 is high enough at growth temperature that cracks and other defects are not formed upon cooling to room temperature, but not so high that defects related to overly large compressive stress are formed.

The nitride material of buffer structure 100 is characterized as having a fractional aluminum composition that decreases or stays constant in a direction away from the substrate 101 throughout the buffer layers 150, with the exception of layer 104. The fractional aluminum composition throughout layer 104 can be greater than that in layer 102 directly adjacent to interface 103, and layer 104 can be at least thick enough to substantially reduce the strain that is in the buffer structure 150 immediately after growth of layer 104, as compared to immediately before growth of layer 104. Because the compressive stress in the buffer layers 150 decreases during growth of the second buffer layer 104, the buffer layers 150 can be grown without generating strain-induced defects to a total thickness which is greater than that which could be achieved in a structure which lacks such a strain-reducing layer. Hence, thick III-N buffer layers can be achieved. Furthermore, the high Al composition in buffer layer 104 can result in a higher average Al composition throughout the buffer layers 150, which can be advantageous for devices such as transistors and diodes.

Any or all of the buffer layers 102, 104, and/or 106 can be doped in order to make them more insulating and/or prevent formation of conductive regions, such as two-dimensional electron gases (2 DEGs). In particular, inclusion of buffer layer 104 can cause a conductive channel to be induced in buffer layer 102 adjacent to layer 104, which can be harmful to the performance of transistors and diodes which may be formed on the buffer structure 100. As such, buffer layers 102, 104, and 106 can be free of any conductive regions, conductive channels, or 2 DEGs. Examples of dopants that can be used include iron (Fe), magnesium (Mg), and carbon (C).

The average bandgap of the buffer structure 100 including first 102, second 104, and third 106 layers can be made higher than alternate buffer structures (e.g., single layer or double layer buffer structures) thus allowing for larger breakdown voltage/fields and/or lower leakage current during operation of devices formed on the buffer structure 100.

The specific compositions and thicknesses of each of the buffer layers 102, 104, and 106 can be selected such that during growth of the layers at growth temperature, which is typically in the range of about 700° C.-1500° C., the compressive stress in the structure never exceeds a value that results in film cracking or other defects associated with excessive compressive stress. Furthermore, the compositions and thicknesses of each of the buffer layers 102, 104, and 106 can be selected such that the III-N layers in the structure are under sufficiently high compressive stress at growth temperature immediately prior to cooling, such that after the structure is cooled to room temperature, the III-N layers are substantially stress free or are under a small compressive or tensile stress at room temperature.

An example implementation of the buffer layer structure 100 of FIG. 1 which was fabricated and shown to prevent defects associated with excessive compressive stress at growth temperature, while resulting in layers that were substantially stress free or were under a small compressive or tensile stress at room temperature after cooling, is as follows. The substrate 101 was SiC, layer 102 was a 145 nanometer thick layer of $Al_{0.37}Ga_{0.63}N$, layer 104 was a 0.37 nanometer thick layer of $Al_{0.56}Ga_{0.44}N$, and layer 106 was a 150 nanometer layer of $Al_{0.295}Ga_{0.705}N$. The structure also included a 180 nm AlN nucleation layer (not shown in FIG. 1) between the SiC substrate and layer 102. In this implementation, layer 104 had a fractional aluminum composition that was more than 1.5 times the maximum aluminum concentration of either of layers 102 and 106. Additionally, the thickness of layer 104 was greater than the thickness of each of layers 102 and 106.

Figure 2:
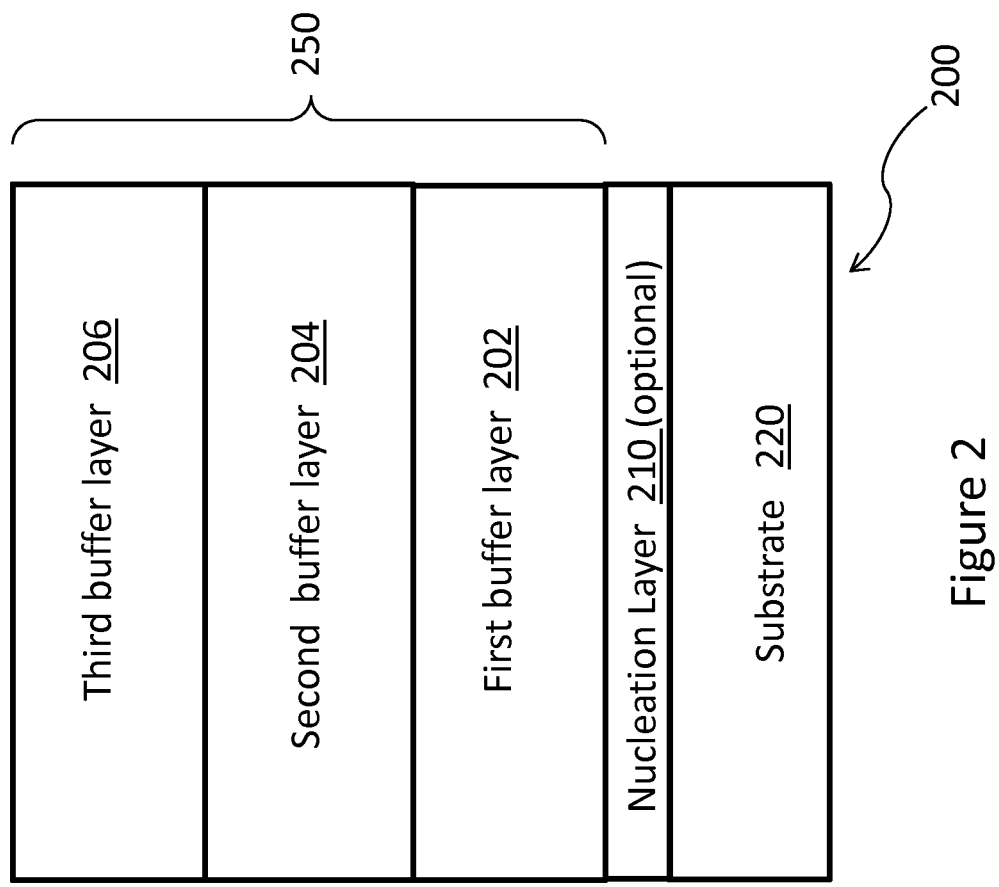
FIGS. 2-4 are cross-sectional views of buffer layers of a buffer structure formed on a foreign substrate.

FIG. 2 is a cross-sectional view of a buffer structure 200 having buffer layers 250 formed on a foreign substrate 220. The buffer layers can, for example, include a first buffer layer 202 having a first III-N material of a first aluminum composition, a second buffer layer 204 having a second III-N material of a second aluminum composition, and a third buffer layer 206. The first III-N material can include $B_aAl_bIn_cGa_dN$, where a+b+c+d is substantially 1 or $Al_xGa_yN$, where x+y is substantially 1. Similarly, the second III-N material can include $B_aAl_bIn_cGa_dN$, where a+b+c+d is substantially 1 or $Al_xGa_yN$, where x+y is substantially 1. The aluminum compositions of the buffer layers 202, 204, and 206 are as described with reference to the description of the example buffer layers 102, 104, and 106 of FIG. 1.

The first buffer layer 202 is disposed over the substrate 220, which can be silicon, SiC, sapphire, or other suitable materials. In one embodiment, the structure 200 can include a nucleation layer 210 formed between the substrate 220 and the first buffer layer 202.

Figure 3:
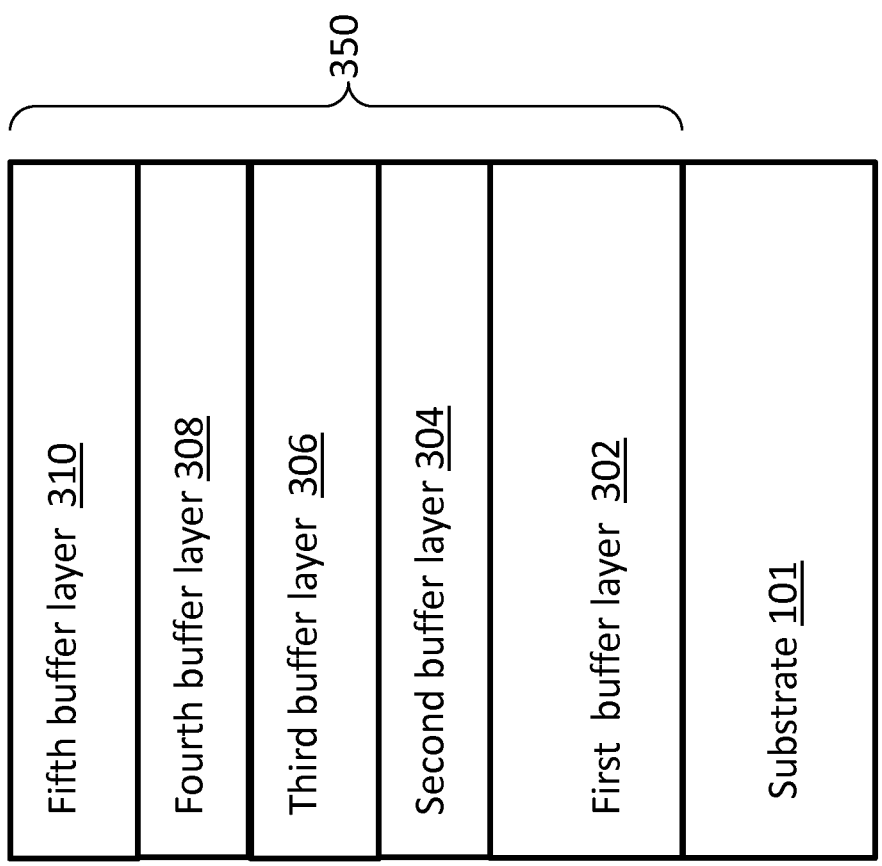

FIG. 3 is a cross-sectional view of a buffer structure which is similar to buffer structure 100 of FIG. 1, but includes multiple layers of higher fractional aluminum composition material within the structure. The first, second, and third buffer layers 302, 304, and 306, respectively, of buffer structure 350 are the same as the buffer layers 102, 104, and 106, respectively, of buffer structure 150 of FIG. 1. However, buffer layers 350 include additional layers 308 and 310. The fractional aluminum composition throughout the fourth buffer layer 308 can be greater than the fractional aluminum composition in the third buffer layer 306 at or directly adjacent to the interface between layers 306 and 308. The fractional aluminum composition throughout the fifth buffer layer 310 can be less than that in the fourth buffer layer 308 at or directly adjacent to the interface between layers 308 and 310. For example, in one implementation the fractional aluminum composition in the fourth buffer layer 308 is uniform throughout the layer, and the fractional aluminum composition of the fifth buffer layer 310 is everywhere lower than that of the fourth buffer layer 308.

The buffer structure of FIG. 3 can be designed as follows. Buffer layers 302, 304, and 306 are first grown to a thickness that is smaller than the critical thickness for defect formation in the structure, as previously described. Next, the fourth buffer layer 308 is deposited directly on top of layer 306. The structure of the fourth buffer layer 308, in which the aluminum composition throughout is greater than that of the portion of buffer layer 306 closest to layer 308, can be such that the compressive stress in any or all of the first, second, and third buffer layers 302, 304, and 306, respectively, decreases as the thickness of layer 308 increases. Fourth buffer layer 308 is grown to a thickness that is smaller than the critical thickness for defect formation in the layer but is thick enough to substantially reduce compressive stress in layers 302, 304, and/or 306. The optimal thickness of layer 308 may depend on the average aluminum composition of layer 308, the compositions and thicknesses of the underlying layers, and the total desired thickness of buffer layers 350. For example, for buffer layers 350 which have an overall thickness of about 3 microns, layer 308 may be greater than 15 nanometers, for example between 15 and 500 nanometers. For buffer layers 350 having an overall thickness of about 5 microns, layer 308 may be greater than 25 or 50 nanometers, for example between 25 and 500 nanometers. If the layers are about 7 microns thick, layer 308 may be greater than 100 or 200 nanometers, for example between 100 and 500 nanometers.

Figure 4:
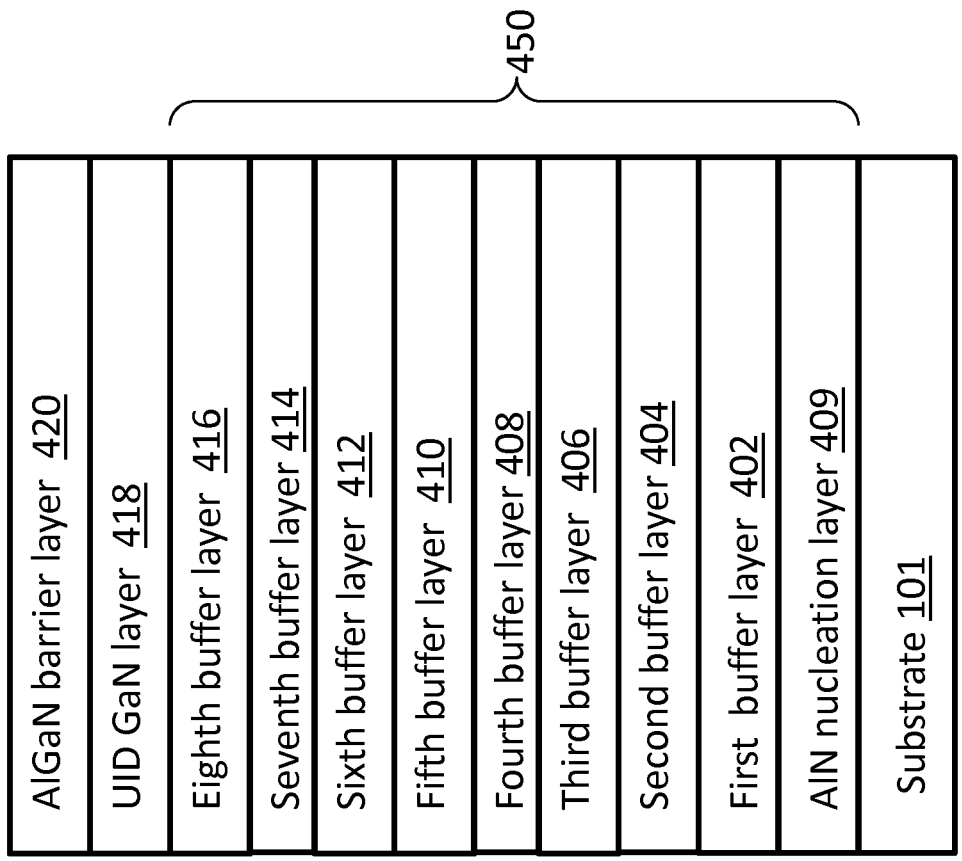

An example implementation of a buffer layer structure similar to that of FIG. 3 which was fabricated and shown to prevent defects associated with excessive compressive stress at growth temperature, while resulting in layers that were substantially stress free or were under a small compressive or tensile stress at room temperature after cooling, is shown in FIG. 4. Layers 402, 404, 406, 408, and 410 of FIG. 4 are the same as layers 302, 304, 306, 308, and 310, respectively, of FIG. 3. The structure of FIG. 4 includes all of the layers shown in FIG. 3, as well as some additional layers. Referring to FIG. 4, the substrate 101 was SiC, layer 402 was a 145 nanometer thick layer of $Al_{0.37}Ga_{0.63}N$, layer 404 was a 370 nanometer thick layer of $Al_{0.56}Ga_{0.44}N$, layer 406 was a 150 nanometer layer of $Al_{0.295}Ga_{0.705}N$, layer 408 was a 370 nanometer thick layer of $Al_{0.56}Ga_{0.44}N$, and layer 410 was a 160 nanometer layer of $Al_{0.215}Ga_{0.785}N$. The structure also included a 180 nm AlN nucleation layer 409 between the SiC substrate and layer 402. The structure also included additional buffer layers on top of layer 410. A 370 nanometer thick layer of $Al_{0.56}Ga_{0.44}N$ 412 was formed directly on layer 410, followed by a 190 nanometer layer of $Al_{0.147}Ga_{0.853}N$ 414, followed by another 370 nanometer thick layer of $Al_{0.56}Ga_{0.44}N$ 416. On top of the final $Al_{0.56}Ga_{0.44}N$ layer 416, a 1 micron layer of unintentionally doped GaN 418 was formed, followed by an AlGaN barrier layer 420, the thickness and composition of the AlGaN barrier layer 420 selected to induce a 2 DEG device channel (not shown) in the GaN layer adjacent to the interface between the GaN layer and the AlGaN barrier layer. A high electron mobility transistor (HEMT) was then formed from the structure described above.

As described, the above implementation included four $Al_{0.56}Ga_{0.44}N$ layers, each having III-N layers directly on either side with lower fractional aluminum compositions and smaller thicknesses than the $Al_{0.56}Ga_{0.44}N$ layers. Furthermore, for each of the AlGaN layers that had a lower fractional aluminum composition than 0.56 (i.e., layers 402, 406, 410, and 414), the aluminum composition decreased monotonically in a direction away from the SiC substrate. For example, layer 402 had an aluminum composition of 0.37, layer 406, which was further from the substrate than layer 402, had an aluminum composition of 0.295, layer 410, which was further from the substrate than layer 406, had an aluminum composition of 0.215, and layer 414, which was further from the substrate than layer 410, had an aluminum composition of 0.147.

Figure 5:
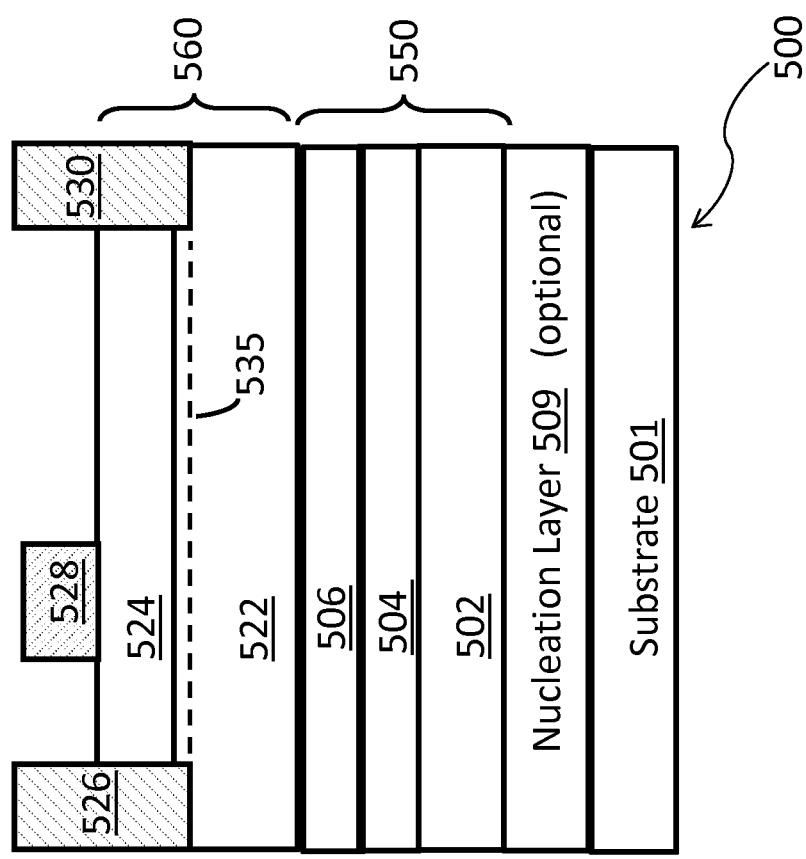
FIG. 5 is a cross-sectional view of an example of a III-N device having a buffer structure with the buffer layers described in accordance with embodiments of the disclosure.

FIG. 5 is a cross-sectional view of an example of a III-N device 500 having buffer layers 550 described in accordance with embodiments of the disclosure. The III-N HEMT structure includes a substrate 501, an optional nucleation layer 509 formed on the substrate 501, such as AlN or $Al_xGa_{1-x}N$, and buffer layers 550. The nucleation layer 509 can be used to allow the III-N materials to nucleate over the substrate, such that the III-N material adjacent to or contacting the substrate has a crystal structure that is at least partially determined by, or at least partially conforms to, that of the substrate. In some instances, a stress management layer (not shown) may also be disposed over the nucleation layer 509 for additional stress control.

The device structure further includes an active device structure 560 disposed over the buffer layers 550, the active device structure including, for example, a channel layer 522, for example a layer of GaN, and a barrier layer 524, such as a layer of $Al_xGa_{1-x}N$, formed over the channel layer 522. A two-dimensional electron gas (2 DEG) channel 535 (illustrated by a dotted line) can be induced in the channel layer 522 near the interface between the channel layer 522 and the barrier layer 524. Alternatively, active device layers formed over the buffer structure 550 can be configured for use in other types of devices, for example, lasers, diodes, LEDs, or photovoltaic cells.

Careful control of the growth or deposition conditions and thickness and structure of buffer layers 550 is utilized to minimize the negative effects of the lattice and thermal mismatches between the channel layer 522 and substrate 501. In one embodiment, the buffer layers 550 include a first buffer layer 502, a second buffer layer 504, and a third buffer layer 506, with aluminum compositions and thicknesses of each layer designed for stress management, as previously described. An example of the relative aluminum compositions in each layer is described with reference the example of FIG. 1 for buffer layers 102, 104, and 106.

In general, during operation of the device 500, the first 502, second 504, and third 506 buffer layers are typically free of mobile carriers (e.g., electrons or holes), or at least substantially free of electrons (but not necessarily holes), such that the buffer layers 550 are electrically insulating or partially insulating, or otherwise non-conductive, or at a minimum, have a very low n-type conductivity. Furthermore, one or more of the buffer layers 502, 504, and/or 506, can be doped for further electrical insulation, for example, with iron (Fe), magnesium (Mg), and/or carbon (C), or with other dopants.

The device can further include source and drain electrodes 526 and 530, respectively, which are formed on opposite sides of the gate electrode 528 and contact the 2 DEG channel 535 in channel layer 522. Gate 528 modulates the portion of the 2DEG 535 in the gate region, i.e., beneath gate 528.

In general, the device 500 can be an enhancement mode FET or a depletion mode FET. Additional examples of typical III-N devices that can be fabricated on foreign substrates and utilize a buffer structure 550 having buffer layers 502, 504, and 506 can include, by way of example but not limitation, High Electron Mobility Transistors (HEMTs), POLFETs, MESFETs, LEDs, Diode Lasers, and Current Aperture Vertical Electron Transistors (CAVETs).

A number of implementations have been described. Nevertheless, it will be understood that various modifications may be made without departing from the spirit and scope of the techniques and devices described herein. Features shown in each of the implementations may be used independently or in combination with one another. Accordingly, other implementations are within the scope of the following claims.

What is claimed is:

1. A method of forming a III-N layer structure, the method comprising:
    forming, a first III-N buffer layer having a first aluminum composition on a first material layer, the first III-N buffer layer having a first side adjacent to the first material layer and a second side opposite the first side;
    forming a second III-N buffer layer on the second side of the first III-N buffer layer, wherein the second III-N buffer layer has a second aluminum composition and is greater than 100 nanometers thick; and
    forming a third III-N buffer layer having a third aluminum composition, the second III-N buffer layer being between the first and third III-N buffer layers; wherein
    the first aluminum composition is substantially constant in the first III-N buffer layer or decreases from the first side to the second side;
    the second aluminum composition in the second III-N buffer layer is greater than the first aluminum composition at the second side of the first III-N buffer layer; and
    the second aluminum composition is uniform throughout the second III-N buffer layer, and the third aluminum composition throughout the third III-N buffer layer is lower than the second aluminum composition.

2. The method of claim 1, wherein a combined thickness of the first, second, and third III-N buffer layers is greater than 3 μm.

3. The method of claim 1, wherein a combined thickness of the first, second, and third III-N buffer layers is greater than 7 μm.

4. The method of claim 1, wherein the first, second, or third III-N buffer layers are doped with at least one element selected from the group consisting of iron (Fe), magnesium (Mg), and carbon (C).

5. A method of forming a III-N layer structure, comprising:
    forming a first III-N buffer layer having a first aluminum composition on a first material layer, the first III-N buffer layer having a first side adjacent to the first material layer and a second side opposite the first side;
    forming a second III-N buffer layer on the second side of the first III-N buffer layer, the second III-N buffer layer having a second aluminum composition and being greater than 15 nanometers thick; and
    forming a third III-N buffer layer having a third aluminum composition, the second III-N buffer layer being between the first and third III-N buffer layers; wherein
    the first aluminum composition is substantially constant in the first III-N buffer layer or decreases from the first side to the second side;
    the second aluminum composition in the second III-N buffer layer is greater than the first aluminum composition at the second side of the first III-N buffer layer; and
    the third III-N buffer layer has a first side adjacent to the second III-N buffer layer and a second side opposite the first side, wherein the third aluminum composition decreases from the first side of the third III-N buffer layer to the second side of the III-N buffer layer.

6. The method of claim 5, wherein the first material layer is a substrate; and
    the third aluminum composition decreases monotonically from the first side of the third III-N buffer layer to the second side of the third III-N buffer layer.

7. The method of claim 5, wherein the second III-N buffer layer is greater than 100 nanometers thick.

8. The method of claim 5, wherein a combined thickness of the first, second, and third III-N buffer layers is greater than 3 μm.

9. The method of claim 5, wherein the first, second, or third III-N buffer layers are doped with at least one element selected from the group consisting of iron (Fe), magnesium (Mg), and carbon (C).

10. A method of forming a III-N layer structure, comprising:
    forming a first III-N buffer layer having a first aluminum composition on a first material layer, the first III-N buffer layer having a first side adjacent to the first material layer and a second side opposite the first side;
    forming a second III-N buffer layer on the second side of the first III-N buffer layer, the second III-N buffer layer having a second aluminum composition and being greater than 15 nanometers thick;
    forming a third III-N buffer layer having a third aluminum composition, wherein the second III-N buffer layer is between the first and third III-N buffer layers; and
    forming an active device layer over the third III-N buffer layer, the active device layer comprising a III-N semiconductor material; wherein the first aluminum composition is substantially constant in the first III-N buffer layer or decreases from the first side to the second side;

the second aluminum composition in the second III-N buffer layer is greater than the first aluminum composition at the second side of the first III-N buffer layer; and the first material layer is a substrate.

11. The method of claim 10, wherein the first material layer is a silicon substrate.

12. The method of claim 11, further comprising removing the substrate to expose a surface of the III-N layer structure.

13. The method of claim 10, the III-N layer structure further comprising a conductive channel of an electronic semiconductor device in the active device layer, wherein the conductive channel is separated from the third III-N buffer layer by at least 20 nanometers.

14. The method of claim 13, further comprising forming an electrode, wherein the electrode is electrically connected to the conductive channel.

15. A method of forming a III-N semiconductor device, comprising:

forming a first III-N buffer layer having a first aluminum composition on a first material layer, the first III-N buffer layer having a first side adjacent to the first material layer and a second side opposite the first side;

forming a second III-N buffer layer on the second side of the first III-N buffer layer, the second III-N buffer layer having a second aluminum composition and being greater than 100 nanometers thick;

forming a third III-N buffer layer having a third aluminum composition, wherein the second III-N buffer layer is between the first and third III-N buffer layers; and forming an active device layer over the third III-N buffer layer, the active device layer comprising a III-N semiconductor material; wherein the first aluminum composition is substantially constant in the first III-N buffer layer or decreases from the first side to the second side;

the second aluminum composition in the second III-N buffer layer is greater than the first aluminum composition at the second side of the first III-N buffer layer;

the second aluminum composition is constant or is non-uniform throughout the second III-N buffer layer;

the third aluminum composition throughout the third III-N buffer layer is lower than a lowest value of the second aluminum composition; and the first material layer is a substrate.

16. The method of claim 15, wherein the III-N semiconductor device further includes a conductive channel in the active device layer, and the III-N semiconductor device is an electronic device.

17. The method of claim 16, wherein the conductive channel is separated from the third III-N buffer layer by at least 20 nanometers.

18. The method of claim 16, wherein the electronic device is a transistor or a diode.

19. The method of claim 16, further comprising forming an electrode, wherein the electrode is electrically connected to the conductive channel.

* * * * *